United States Patent
Castro et al.

(10) Patent No.: US 11,854,947 B2
(45) Date of Patent: *Dec. 26, 2023

(54) INTEGRATED CIRCUIT CHIP WITH A VERTICAL CONNECTOR

(71) Applicant: Texas Instruments Incorporated, Dallas, TX (US)

(72) Inventors: Abram M. Castro, Carrollton, TX (US); Steven Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 371 days.

This patent is subject to a terminal disclaimer.

(21) Appl. No.: 17/069,655

(22) Filed: Oct. 13, 2020

(65) Prior Publication Data

US 2021/0028093 A1 Jan. 28, 2021

Related U.S. Application Data

(63) Continuation of application No. 14/985,947, filed on Dec. 31, 2015, now Pat. No. 10,804,185.

(51) Int. Cl.
*H01L 23/495* (2006.01)
*H01L 25/16* (2023.01)
(Continued)

(52) U.S. Cl.
CPC .......... *H01L 23/4952* (2013.01); *H01L 23/28* (2013.01); *H01L 23/49524* (2013.01);
(Continued)

(58) Field of Classification Search
CPC ........... H01L 23/4952; H01L 23/49575; H01L 25/16; H01L 23/3107; H01L 23/49513;
(Continued)

(56) References Cited

U.S. PATENT DOCUMENTS

| | | | | |
|---|---|---|---|---|
| 5,856,212 A | * | 1/1999 | Chun | ............... H01L 23/3107 438/126 |
| 7,646,083 B2 | | 1/2010 | Yeung et al. | |

(Continued)

FOREIGN PATENT DOCUMENTS

| | | |
|---|---|---|
| CN | 101548377 A | 9/2009 |
| CN | 103582946 A | 2/2014 |

(Continued)

OTHER PUBLICATIONS

CN Office Action dated May 17, 2021.

*Primary Examiner* — Caleb E Henry
*Assistant Examiner* — Dilinh P Nguyen
(74) *Attorney, Agent, or Firm* — Dawn Jos; Frank D. Cimino (57) ABSTRACT

An integrated circuit (IC) chip can include a die with an interconnect conductively coupled to a leadframe, wherein the leadframe forms a portion of a given surface of the IC chip. The IC chip can also include an encapsulating material molded over the die and the leadframe. The encapsulating material can form another surface of the IC chip. The other surface of the IC chip opposes the given surface of the IC chip. The IC chip can further include a vertical wire extending through the encapsulating material in a direction that is substantially perpendicular to the given surface of the IC chip and the vertical wire protruding through the other surface of the IC chip to form a vertical connector for the IC chip. The vertical connector can be coupled to the interconnect on the die.

20 Claims, 5 Drawing Sheets

(51) Int. Cl.
*H01L 23/28* (2006.01)
*H01L 23/31* (2006.01)

(52) U.S. Cl.
CPC .. *H01L 23/49568* (2013.01); *H01L 23/49575* (2013.01); *H01L 25/16* (2013.01); *H01L 23/3107* (2013.01); *H01L 23/49513* (2013.01); *H01L 2224/16245* (2013.01); *H01L 2224/18* (2013.01); *H01L 2224/32245* (2013.01); *H01L 2224/48091* (2013.01); *H01L 2224/48247* (2013.01); *H01L 2224/73265* (2013.01); *H01L 2924/19107* (2013.01)

(58) Field of Classification Search
CPC . H01L 2224/32245; H01L 2224/48091; H01L 2224/48247; H01L 2224/73265
USPC ......................................................... 257/675
See application file for complete search history.

(56) References Cited

U.S. PATENT DOCUMENTS

| | | | |
|---|---|---|---|
| 7,960,815 | B2 | 6/2011 | Camacho et al. |
| 8,709,870 | B2 | 4/2014 | Huening |
| 8,729,682 | B1 | 5/2014 | Davis et al. |
| 8,962,395 | B2 | 2/2015 | Shen |
| 9,159,586 | B1 | 10/2015 | Huening |
| 2002/0130400 | A1 | 9/2002 | Jeong et al. |
| 2006/0247734 | A1* | 11/2006 | Greenberg ......... A61N 1/37518 607/54 |
| 2008/0246133 | A1 | 10/2008 | Derderian |
| 2010/0123226 | A1 | 5/2010 | Chen et al. |
| 2010/0314731 | A1* | 12/2010 | Camacho .............. H01L 21/565 257/676 |
| 2011/0089547 | A1 | 4/2011 | Holloway |
| 2014/0077363 | A1 | 3/2014 | Lin et al. |
| 2014/0210062 | A1 | 7/2014 | Miyazaki |
| 2014/0239471 | A1 | 8/2014 | Khunpukdee et al. |
| 2014/0284779 | A1 | 9/2014 | Hayata et al. |
| 2014/0302640 | A1 | 10/2014 | Qin |
| 2014/0312503 | A1 | 10/2014 | Seo |
| 2015/0102478 | A1 | 4/2015 | Suthiwongsunthorn et al. |
| 2016/0247748 | A1 | 8/2016 | Kinzer |

FOREIGN PATENT DOCUMENTS

| | | |
|---|---|---|
| EP | 1478014 A1 | 11/2004 |
| WO | 2015109157 A1 | 7/2015 |

* cited by examiner

INTEGRATED CIRCUIT CHIP WITH A VERTICAL CONNECTOR

This application is a continuation of U.S. patent application Ser. No. 14/985,947, filed Dec. 31, 2015, the contents of which are herein incorporated by reference in its entirety.

TECHNICAL FIELD

This disclosure relates to an integrated circuit (IC) chip with a vertical connector. More particularly, this disclosure relates to an IC chip with a vertical connector formed by a vertical wire.

BACKGROUND

Electronic packaging (or simply "packaging") can refer to enclosures and protective features built into an electronic product, such as an integrated circuit (IC) chip. Electronic packaging applies both to end products and to components. Packaging of an electronic system must consider protection from mechanical damage, cooling, radio frequency noise emission, protection from electrostatic discharge, maintenance, operator convenience and cost. A semiconductor package can be a metal, plastic, glass or ceramic casing containing one or more semiconductor electronic components. Individual discrete components are typically etched in a silicon wafer before being cut and assembled in a package. The package provides protection against impact and corrosion and dissipates heat produced in the device.

Flat no-leads packages such as quad-flat no-leads (QFN), dual-flat no-leads (DFN) physically and electrically connect IC chips to substrates such as printed circuit boards (PCBs). Flat no-leads, also known as micro leadframe (MLF) and SON (small-outline no leads), is a surface-mount technology, one of several package technologies that connect ICs to the surfaces of PCBs without through-holes. Flat no-lead is a near chip scale package plastic encapsulated package made with a planar copper leadframe substrate. Perimeter leads on the package bottom can provide electrical connections to the PCB. Flat no-lead packages include an exposed thermal pad to improve heat transfer out of the IC (into the PCB). Heat transfer can be further facilitated by metal vias in the thermal pad.

SUMMARY

One example relates to an integrated circuit (IC) chip. The IC chip can include a die with an interconnect conductively coupled to a leadframe, wherein the leadframe forms a portion of a given surface of the IC chip. The IC chip can also include an encapsulating material molded over the die and the leadframe. The encapsulating material can form another surface of the IC chip, wherein the other surface of the IC chip opposes the given surface of the IC chip. The IC chip can further include a vertical wire extending through the encapsulating material in a direction that is substantially perpendicular to the given surface of the IC chip and the vertical wire protruding through the other surface of the IC chip to form a vertical connector for the IC chip. The vertical connector can be coupled to the interconnect on the die.

Another example relates to an electrical circuit that can include an IC chip. The IC chip can include a die with an interconnect conductively coupled to a leadframe, wherein the leadframe forms a portion of a given surface of the IC chip. The IC chip can also include a given vertical wire and another vertical wire, each extending through encapsulating material of the IC chip in a direction that is substantially perpendicular to the given surface of the IC chip. The given and the other vertical wires can protrude through the encapsulating material at another surface of the IC chip to form respective given and another vertical connectors for the IC chip. The given and the other vertical connectors can be coupled to different points on the interconnect of the die. The electrical circuit can also include a surface mount technology (SMT) component adhered to the IC chip and conductively coupled to the given and the other vertical connectors to form a current path between the different points on the interconnect of the die.

Yet another example relates to another integrated circuit (IC) chip. The IC chip can include a die with an interconnect conductively coupled to a leadframe, wherein the leadframe forms a portion of a given surface of the IC chip, and the die can include an active surface that faces the leadframe. The IC chip can also include an encapsulating material molded over the die and the leadframe, the encapsulating material forming another surface of the IC chip. The other surface of the IC chip can oppose the given surface of the IC chip. The IC chip can further include a vertical wire extending from a particular lead on the leadframe in a direction substantially perpendicular to the given surface of the IC chip. The vertical wire can extend through the encapsulating material to form a vertical connector. The particular lead of the leadframe can also be coupled to an interconnect of the IC chip.

Still yet another example relates to an IC chip that can include a given die with a given interconnect conductively coupled to a leadframe, wherein the leadframe forms a portion of a given surface of the IC chip. The IC chip can also include another die with another interconnect conductively coupled to the leadframe. The IC chip can further include an encapsulating material molded over the die and the leadframe, the encapsulating material forming another surface of the IC chip. The other surface of the IC chip opposes the given surface of the IC chip. The IC still further includes a given and another vertical wire extending through the encapsulating material in a direction that is substantially perpendicular to the given surface of the IC chip and the given and the other vertical wires protruding through the other surface of the IC chip to form a respective given vertical connector and another vertical connector for the IC chip. The given vertical connector can be coupled to the given interconnect on the given die and the other vertical connector can be coupled to the other interconnect on the other die.

DETAILED DESCRIPTION

An integrated circuit (IC) chip can include a vertical wire in conjunction with a film assisted mold to form a vertical connector (e.g., a vertical connection point) in the IC chip (or package), including a flat no-leads package such as quad-flat no-leads (QFN) package or a dual-flat no-leads (DFN) package. The vertical wire can be placed via a standard wire bond platform including ribbon bonding techniques and can be extended from either a die surface of the IC chip or from a leadframe lead, thru the mold compound, and exposed at a surface opposing the leadframe of the IC chip, which surface can be referred to simply as an opposing surface (or "top" surface).

Further, a solder ball or solder paste can be applied to the exposed wire, enabling a larger area for surface mount-technology (SMT). Additionally, in some examples, this solder paste or solder ball could be lead (Pb) free such as a conductive epoxy, thereby reducing an impact of a secondary reflow process. Once the vertical connector is formed, a desired component (or multiple components) can be adhered to the opposing side of the IC chip by employing surface mount technology (SMT) techniques either at a time of manufacture of the IC chip or at a time the IC chip is mounted in another device.

Figure 1:
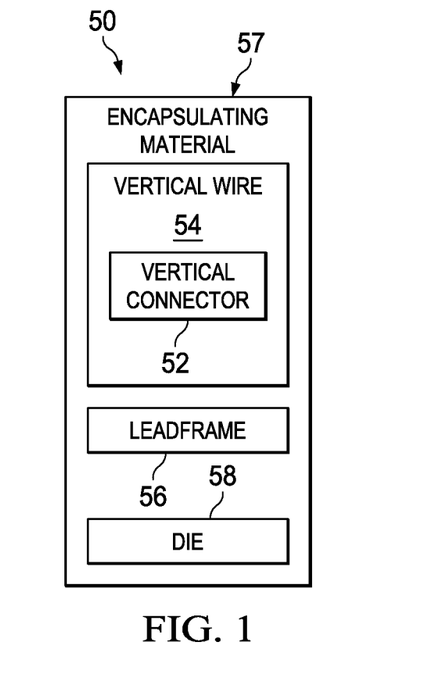
FIG. 1 illustrates an example of an integrated circuit (IC) chip with a vertical connector.

FIG. 1 illustrates an example of an IC chip 50 that can be employed to implement a vertical connector 52 (e.g., a vertical connection point) for connecting to external components to the IC chip 50. The vertical connector 52 can be a component of a vertical wire 54 that extends in a direction away from a leadframe 56 and protrudes out an opposing surface of an encapsulating material 57 of the IC chip 50 to form the vertical connector 52. As used herein, the term "vertical wire" (including the vertical wire 54) denotes a wire that extends in a direction normal (e.g., perpendicular) with respect to a surface of the leadframe 56 that forms a surface of the IC chip 50 (e.g., a "bottom" surface of the IC chip 50).

The leadframe 56 of the IC chip 50 can carry signals from a point on an interconnect on a die 58 to components outside the IC chip 50. The leadframe 56 can be formed of metal, such as copper or gold. The die 58 can be formed as a block of semiconducting material (e.g., silicon), in which a given functional circuit of the IC chip 50 is fabricated. In some examples, the vertical wire 54 can be directly conductively connected to the die 58. In other examples, the vertical wire 54 can be conductively coupled to the die 58 via a wire bond or a lead on the leadframe 56.

Figure 2:
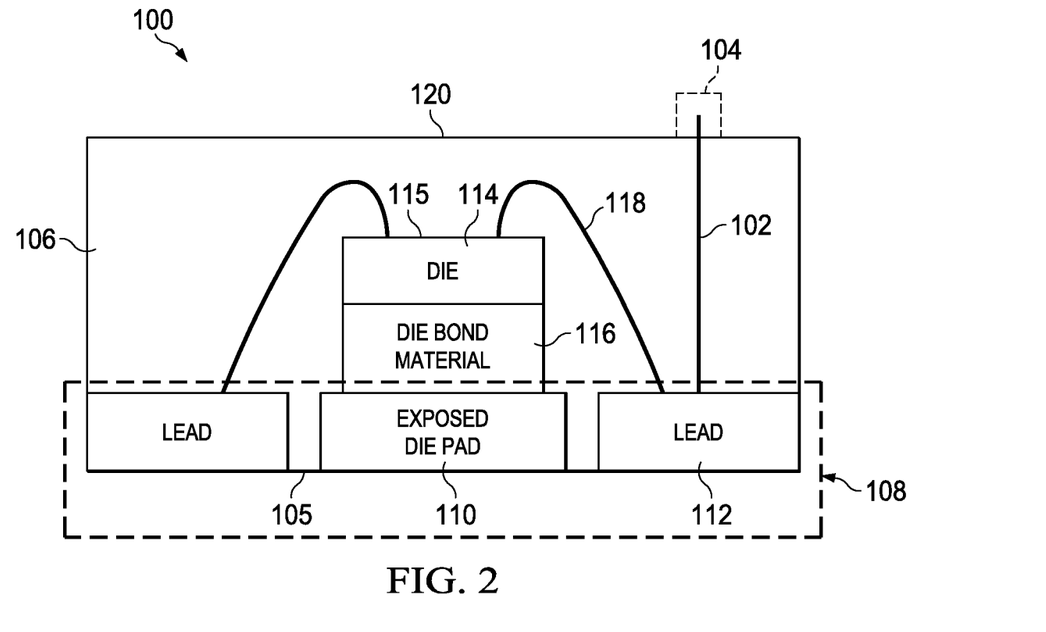
FIG. 2 illustrates another example of an IC chip with a vertical connector.

FIG. 2 illustrates an example of an IC chip 100 that could be employed to implement the IC chip 50 of FIG. 1. The IC chip 100 includes a vertical wire 102 with a vertical connector 104 that extends beyond a boundary of an encapsulating material 106 of the IC chip 100.

The encapsulating material 106 could be, for example, plastic or similar inert and non-conducting material. A given surface 105 (e.g., a "bottom") of the IC chip 100 can include a leadframe 108. That is, the leadframe 108 can form the given surface 105 or some portion thereof. In the example illustrated in FIG. 2, the leadframe 108 is formed of multiple portions. In the example illustrated in FIG. 2, the leadframe 108 includes an exposed die pad 110 and a lead 112. It is noted that the leadframe 108 may have many leads (e.g., up to about 100) that are coupled to other devices through the given surface 105 upon mounting the IC chip 100 in an electrical circuit. The exposed die pad 110 can be, for example, coupled to a heat sink. A die 114 can be mounted on the exposed die pad 110 via a die bond material 116. The die bond material 116 could be, for example, a thermally conducting but electrically insulating material, such as thermal paste. The lead 112 (and other portions of the leadframe 108) can be formed of an electrically conductive material, such as copper or gold.

A wire bonding 118 forms a conductive path between an interconnect on an active surface 115, the die 114 and the lead 112. In the example illustrated in FIG. 2, the die 114 has an active surface (a surface with points on the interconnect) that faces away from the leadframe 108. The vertical wire 102 can be mounted on the lead 112 of the leadframe 108. In some examples, the vertical wire 102 can be positioned to terminate on the lead 112 using standard wire bond platforms, including ribbon bonding techniques. Moreover, the vertical wire 102 can be formed to compensate for wire sweep caused by a curing of the encapsulating material 106. Furthermore, the vertical connector 104 of the vertical wire 102 can be formed with a molding process (e.g., film assist molding) that can obviate the need for etching and/or grinding away a portion of the encapsulating material 106. The vertical wire 102 can extend vertically (e.g., in a substantially perpendicular direction) from the given surface 105 of the lead 112, through the encapsulating material 106 such that the vertical connector 104 is exposed at a surface opposing the surface of the leadframe 108, which surface can be referred to as an opposing surface 120 (or "top" surface). The vertical wire 102 can be formed of a processing technique, such as film-assist molding. An external component, such as a discrete passive circuit component (e.g., a relatively large inductor or a capacitor) or another IC chip 100 (e.g., a digital circuit component) can be coupled to the vertical connector 104 in a manner described herein.

Figure 3:
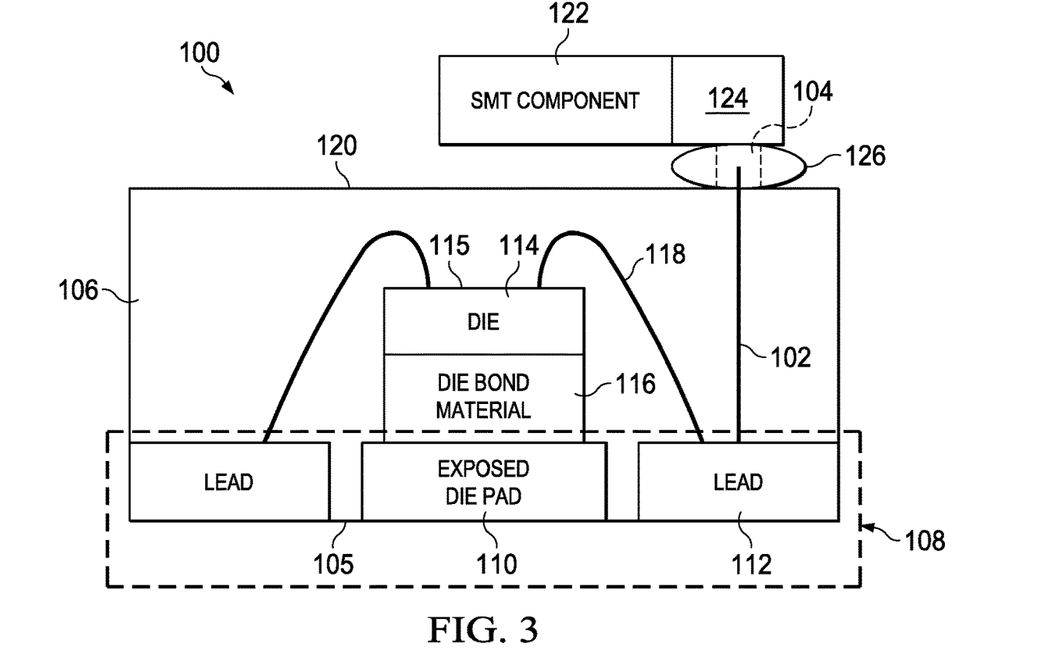
FIG. 3 illustrates an example of the IC chip of FIG. 2 coupled to an external component.
Figure 4:
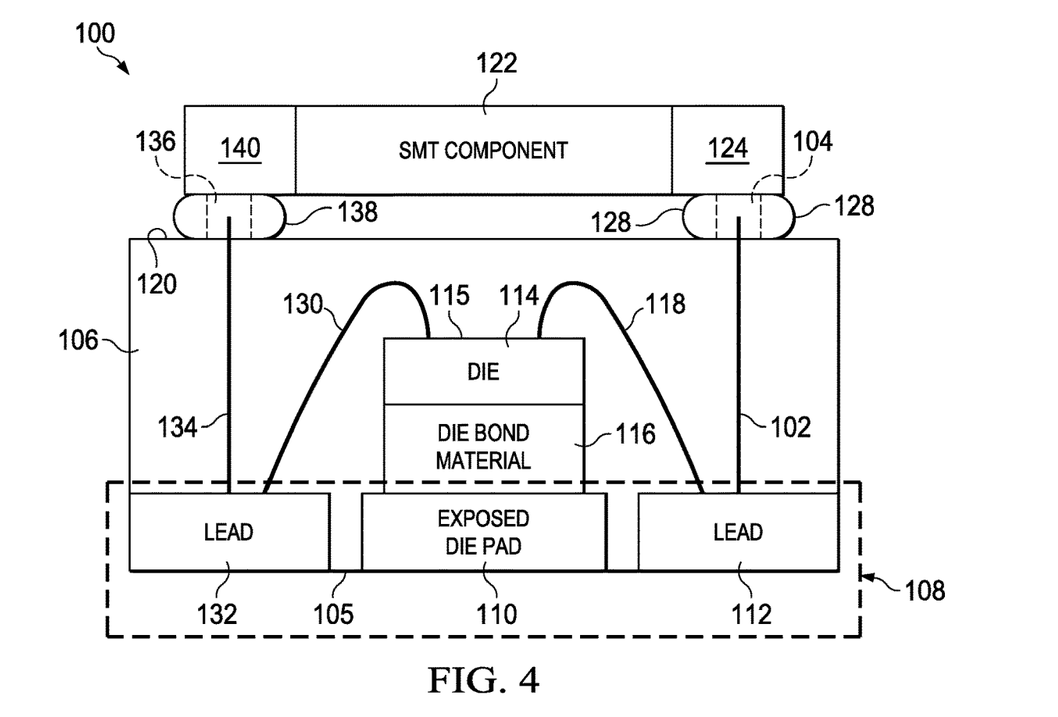
FIG. 4 illustrates another example of the IC chip of FIG. 2 coupled to an external component.

FIGS. 3 and 4 depict specific examples of the IC chip 100 of FIG. 2 implemented in different electrical circuits. For purposes of simplification of explanation, the same reference numbers are employed in FIGS. 2-4 to denote the same structure. The IC chip 100 is coupled to an external SMT component 122 mounted on (e.g. adhered to) the IC chip 100. The SMT component 122 could be, for example, a relatively high-power passive component, such as an inductor. The SMT component 122 can include a connector 124 that is coupled to the vertical connector 104 of the IC chip 100. Moreover, solder paste 126 can be applied to the vertical connector 104 to conductively couple the SMT component 122 to the die 114 via the vertical wire 102, the lead 112 of the leadframe 108 and the wire bonding 118. It is noted that in FIG. 3, only a portion of the SMT component 122 is illustrated. In some examples, another connector of the SMT component 122 could be included that may connect, for example, to another die on the IC chip 100 (e.g., a die hidden from view in the perspective illustrated in FIG. 3).

FIG. 4 illustrates a similar configuration as FIG. 3. However, instead of the solder paste 126, a pre-deposited solder ball 128 is employed. Additionally, in FIG. 4, a second wire bond 130 can lead to a second lead 132 of the leadframe 108. The second lead 132 can be coupled to a second vertical wire 134 with a second vertical connector 136. A second solder ball 138 can be adhered to the second vertical connector 136. Moreover, the second vertical connector 136 can be coupled to a second connector 140 of the SMT component 122. Thus, in the configuration of the IC chip 100 illustrated in FIG. 4, a full current path between different points on the interconnect (connected to the wire bondings 118 and 130) of the die 114 through the SMT component 122 can be formed.

Figure 5:
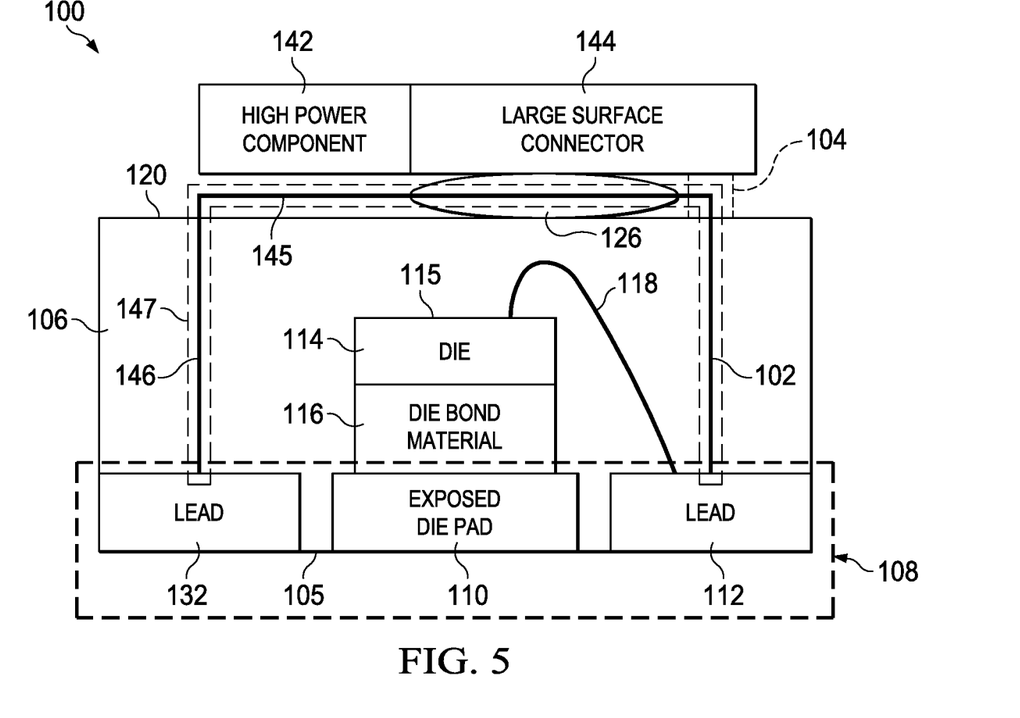
FIG. 5 illustrates yet another example of the IC chip of FIG. 2 coupled to an external component.

FIG. 5 illustrates another specific example of the IC chip 100 of FIG. 2. For purposes of simplification of explanation, the same reference numbers are employed in FIGS. 2-5 to denote the same structure. In FIG. 5, the IC chip 100 is coupled to an external high power component 142. The high power component 142 could be, for example, a transformer. The high power component 142 can include a large surface connector 144, such as a lead to a transformer. As used herein, the large surface connector can conduct high power signals (e.g., up to about 100 Watts (W)).

In the example illustrated in FIG. 5, the vertical connector 104 can be connected to a crossbar 145 to form a high power connection 147. The high power connection 147 can also include a receding portion 146 that can, in some examples, leads back to the second lead 132 of the leadframe 108. In other examples, the receding portion 146 may terminate short of the second lead 132. In this manner, the high power connection 147, including the vertical wire 102, the crossbar 145 and the receding portion 146 can form a 'U' or "staple" shape that increases surface area (as compared to the vertical connector 104 by itself) to provide sufficient current flow and voltage for the high power component 142. The cross bar 145, the vertical connector 104 and the receding portion 146 of the high power connection 147 (or some portions thereof) can be a ribbon bonding wire that supports high power (e.g., up to about 100 W). Similar to FIG. 3, it is noted that in FIG. 5, only a portion of the high power component 142 is illustrated. In some examples, another connector of the high power component 142 could be included that may connect, for example, to another die on the IC chip 100 (e.g., a die hidden from view in the perspective illustrated in FIG. 5). Alternatively, the other connector of the high power component 142 could be connected to another point on the interconnect of the die 114 in a manner similar to the configuration illustrated with respect to FIG. 4.

Figure 6:
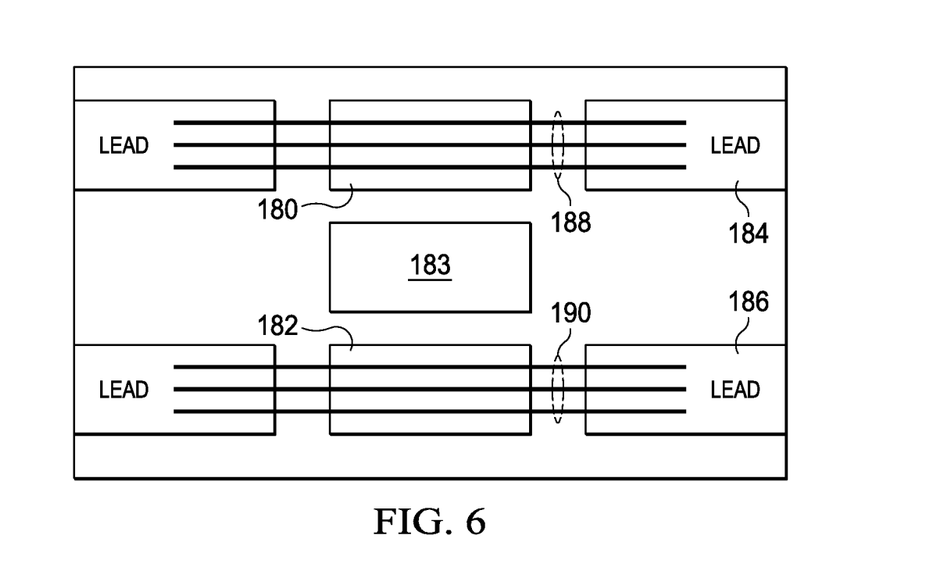
FIG. 6 illustrates another view of the IC chip of FIG. 5.

In some examples of the IC chip 100, multiple parallel (or offset) vertical lines can be included. For instance, in FIG. 5, additional instances of the high power connector 147 can be included, which additional instances are hidden from view in the illustration of FIG. 5. Additionally or alternatively, multiple instances of the other components of the IC chip 100 can also be included, such as the die 114. FIG. 6 illustrates an example of the IC chip 100 of FIG. 5 from a view of the opposing surface 120 (without the high power component), which can be referred to as a "top" view.

In FIG. 6, a given die 180 and another die 182 are included on the IC chip 100. Additionally, an intervening die 183 can be positioned between the given die and the other die 182. Each of the given die 180 and the other die 182 can be implemented as instances of the die 114. The given die 180 and the other die 182 can be connected to leads 184 and 186, respectively (which can be instances of the lead 112). Additionally, each lead 184 and 186 can be connected to a set of two (2) power connectors 188 and 190, respectively. In the example illustrated in FIG. 6, the interleaving die 183 is not connected to a power connector. Each power connector in the sets of power connectors 188 and 190 can be instances of the power connector 147 of FIG. 5. Inclusions of the sets of power connectors 188 and 190 can further increase the power supported by the IC chip 100. In other examples, more or less power connectors can be included in each set of power connectors 188 and 190.

In some examples, a component, such as the high power component 142 can be coupled between the sets of power connectors 188 and 190. In this manner, the given die 180 and the other die 182 can be communicatively coupled via the high power component.

Figure 7:
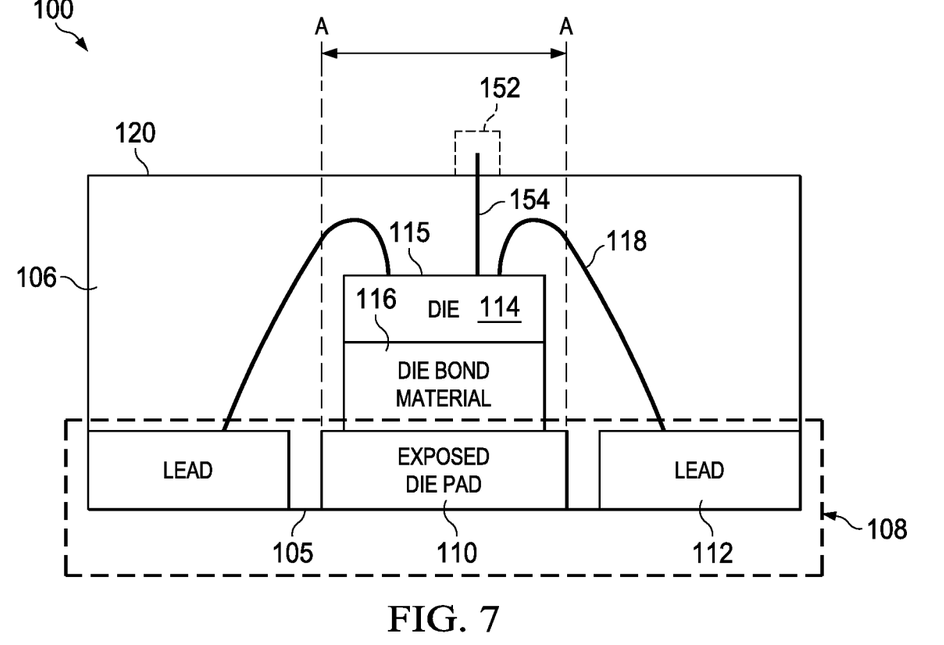
FIG. 7 illustrates yet another example of an IC chip with a vertical connector.

FIG. 7 illustrates another example of the IC chip 100 illustrated in FIG. 2 that implements an alternative configuration of a vertical connector 152. For purposes of simplification of explanation, the same reference numbers are employed in FIGS. 2 and 6 to denote the same structure. In FIG. 7, a vertical wire 154 is connected directly to a point on the interconnect on the active surface 115 of the die 114. Additionally, the vertical wire 154 protrudes out the encapsulation material 106 to form the vertical connector 152. In this manner, the lead 112 is freed for connection to another component (or for connection to another vertical connector). The configuration illustrated in FIG. 7 can be employed, for example, in situations where the IC chip 100 is being connected to an external component with a relatively small surface area (e.g., small footprint). That is, the IC chip 100 of FIG. 7 could be employed in situations where an external component fits within (or nearly within) a boundary defined by imaginary lines A-A (the boundary of the exposed die pad 110).

Referring back to FIG. 2, by implementing the IC chip 100 with the vertical wire 102, space savings can be achieved. In particular, previously unused space, namely, space adjacent (e.g., above) the opposing surface 120 can be utilized. In this manner, chip stacking can be easily implemented. Electrical circuit packages such as power supplies and/or Systems In a Package (SiPs) can benefit from the architecture of the IC chip 100 with the vertical wire 102.

The inclusion of the vertical wire 102 and the vertical connector 104 can reduce or eliminate the need for embedded active devices in costly substrates that employ a substrate based interconnect (e.g., a printed circuit board (PCB)) to access the external SMT components. In particular, components can be mounted directly on (e.g., adhered to) the IC chip 100 (as illustrated in FIGS. 3-5), such that no intermediate substrate (e.g., a PCB) is need. Additionally or alternatively, SiP can be implemented in leaded packages with more room or much larger flat no-lead components where X/Y space is very limited.

Figure 8:
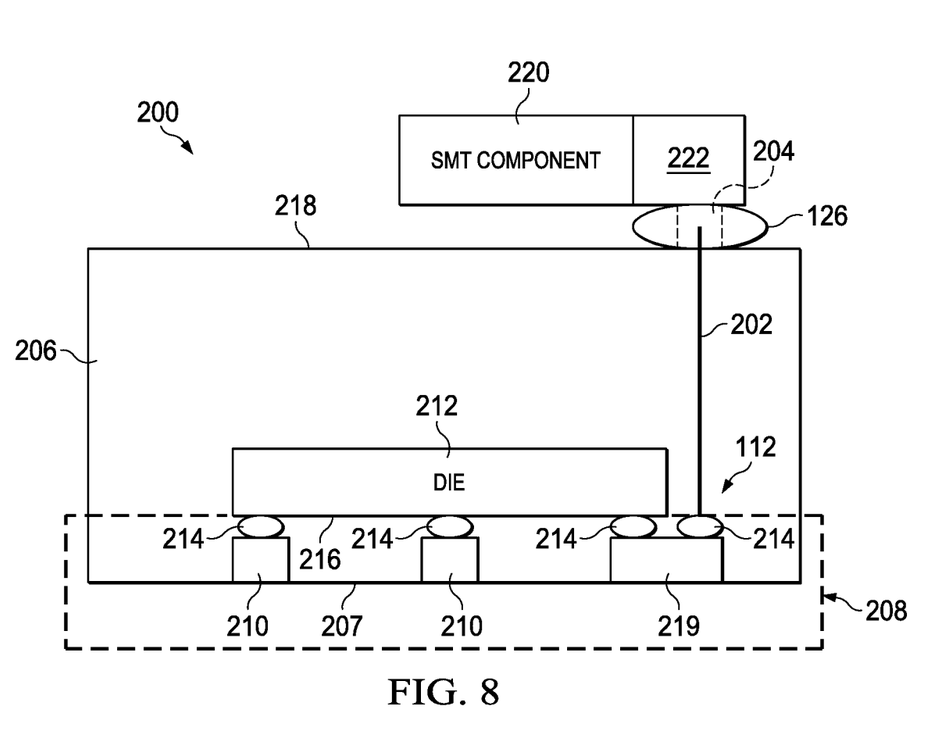
FIG. 8 illustrates still yet another example of an IC chip with a vertical connector coupled to an external component.

FIG. 8 illustrates another alternative example of an IC chip 200 that can be employed to implement the IC chip 50 of FIG. 1. The IC chip 200 includes a vertical wire 202 with a vertical connector 204 that extends beyond a boundary of an encapsulating material 206 of the IC chip 200.

The encapsulating material 206 could be, for example, plastic or similar inert and non-conducting material (e.g., similar to the encapsulating material 106 of FIGS. 2-6). A given surface 207 (e.g., a "bottom" surface) of the IC chip 200 can include (and/or be composed of) a leadframe 208. The leadframe 208 can include a plurality of leads 210 that are coupled to a corresponding plurality of points on an interconnect on a die 212 of the IC chip 200 via connection material 214. The connection material 214 can be implemented, for example, as solder balls or copper pillars.

The die 212 can have an active surface 216 that faces the leadframe 208. Thus, the active surface 216 of the die faces away from a surface 218 of the IC chip 200 that opposed the leadframe 208 (referred to as the opposing surface 218 or "top" surface). In this manner, the die 114 can be mounted by employing flip-chip techniques or "Hot Rod" techniques.

The vertical wire 202 can extend in a substantially perpendicular direction from a given lead 219 of the leadframe 208. The given lead 219 can also be connected to a particular interconnect of the die 212. The given lead 219 can be conductively connected to the die 212 and the vertical wire 202 via connection material 214. The vertical wire 202 protrudes through the opposing surface 218 of the IC chip 200 to form the vertical connector 204.

The vertical connector 204 can be employed to provide conductive coupling between an external component, including but not limited to an SMT component 220 and the point on the interconnect of the die 212 coupled to the given lead 219. In particular, the vertical connector 204 can be coupled to a connector 222 (e.g., a lead) of the SMT component 220.

Flip-chip (or copper pillar) techniques can be employed to fabricate the IC chip 200. Additionally, the IC chip 200 can achieve the same or similar advantages as the IC chip 100 illustrated and described with respect to FIG. 2. Moreover, the IC chip 200 can be modified to accommodate a large variety of environments of application, including those illustrated and described with respect to FIGS. 3-5 (e.g., a full current path, high power external components and/or a high power connection).

Additionally, similarly to FIGS. 3 and 5, in FIG. 8 only a portion of the SMT component 220 is illustrated. However, in some examples, another connector of the SMT component can be coupled to another die on the IC Chip 200 that could be hidden from view in the perspective illustrated in FIG. 8. Alternatively, the other connector of the SMT component 220 could be connected to another point on the interconnect of the die 212 in a manner similar to the configuration illustrated with respect to FIG. 4.

Figure 9:
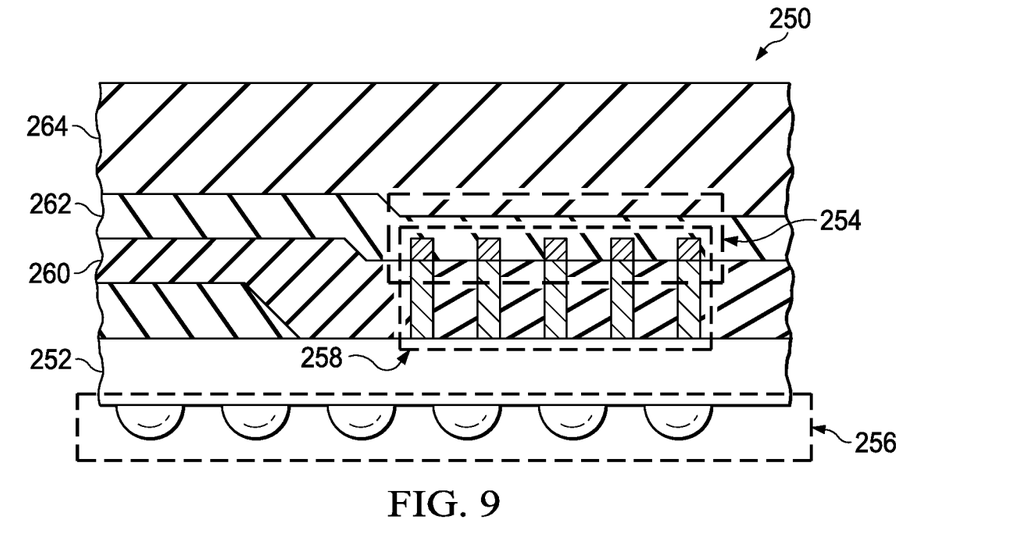
FIG. 9 illustrates an example of a film assist mold for forming an IC chip.

FIG. 9 illustrates an example of a portion of a film assist mold 250 applied to an IC chip 252 during fabrication of a plurality of vertical connectors 254. The film assist mold 250 can be employed to assist in fabrication of the IC chip 50 of FIG. 1, the IC chip 100 of FIGS. 2-6 and/or the IC chip 150 of FIG. 8. The IC chip 252 can include a plurality of solder balls 256 (or other connectors), wherein each of the plurality of solder balls 256 is connected to an individual point of an interconnect on the IC chip 252. A plurality of vertical wires 258 can extend from the IC chip 252, through an overmold 260 of the IC chip 252 to form the vertical connectors 254.

A mold film 262 can be flowed over the vertical connectors 254 and a mold tool 264 of the film assist mold 250 can be employed to "clamp down" on the IC chip 252 to apply pressure to the mold film 262. Upon curing the mold film 262, the mold tool 264 can be released/removed, which can cause the mold film 262 to be removed as well. Only a small protective coating (film) of the mold film 262 is left on tips of the vertical wires 258 to form the vertical connectors 254.

Figure 10:
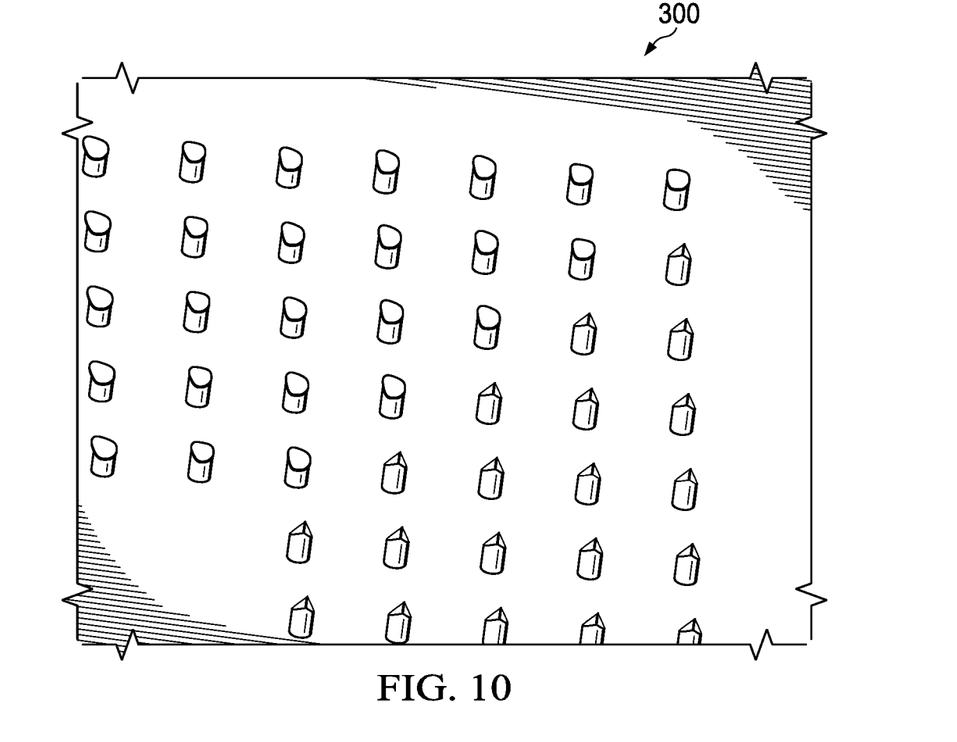
FIG. 10 illustrates a diagram of a plurality of vertical connectors of an IC chip.

FIG. 10 illustrates a diagram of an IC chip after removal of the film assist mold 250. In FIG. 10, a plurality of vertical connectors 300 of an IC chip are illustrated. Referring back to FIG. 9, by employment of the film assist mold 250, the vertical connectors 254 can be efficiently and repeatedly formed in a production fabrication environment without the need for expensive grinding and/or etching techniques.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit (IC) chip comprising:
   a die attached to a die pad and electrically connected to a first lead of a plurality of leads;
   encapsulating material covering portions of the die, the die pad, the first lead and a second lead of the plurality of leads, the encapsulating material forming a first surface and a second surface of the IC chip opposite of the first surface;
   a first wire electrically connected to and extending from the first lead, the first wire protruding through the second surface beyond a plane of the second surface;
   a cross bar electrically connected to and laterally extending from the first wire; and
   a power component attached and electrically connected to the cross bar.

2. The IC chip of claim 1 further comprising a second wire electrically connected to and extending from the cross bar, the second wire extending from the second surface to the second lead.

3. The IC chip of claim 2, wherein the second wire is electrically connected to the second lead.

4. The IC chip of claim 2, wherein the first surface is coplanar with a surface of the die pad.

5. The IC chip of claim 2, wherein the first wire and the second wire are substantially perpendicular to the plane of the second surface.

6. The IC chip of claim 1, wherein the power component includes a transformer.

7. The IC chip of claim 1 further comprising solder between the cross bar and the power component.

8. An integrated circuit (IC) chip comprising:
   a die pad and a plurality of leads;
   a die attached to the die pad and electrically connected to at least one of the plurality of leads;
   encapsulating material covering portions of the die and the plurality of leads, the encapsulating material forming a first surface and a second surface of the IC chip opposite of the first surface, the first surface and second surface being external surfaces of the IC chip; and
   a wire electrically connected to and extending from the at least one of the plurality of leads, the wire protruding through the second surface beyond a plane of the second surface.

9. The IC chip of claim 8, further comprising a surface mount component on the IC chip and electrically connected to the wire.

10. The IC chip of claim 9, wherein the surface mount component includes an inductor.

11. The IC chip of claim 8, further comprising solder at an end of the wire that is protruding through the second surface.

12. The IC chip of claim 8, wherein the solder includes a solder ball.

13. The IC chip of claim 12, wherein the solder ball covers the end of the wire.

14. The IC chip of claim 8, wherein the wire extends from the at least one of the plurality of leads in a direction substantially perpendicular to a plane of the second surface.

15. The IC chip of claim 8, wherein the wire is electrically connected to the at least one of the plurality of leads via one of a solder ball and a copper ball.

16. The IC chip of claim 8, wherein the wire protrudes beyond a plane of the second surface in a direction substantially perpendicular to the plane of the second surface.

17. The IC chip of claim 8, wherein the surface of the die pad is exposed from the IC chip.

18. The IC chip of claim 8, wherein a wire bond couples an interconnect of the die to the at least one of the plurality of leads.

19. An integrated circuit (IC) chip comprising:
   a die attached to a die pad and electrically connected to at least two of a plurality of leads;
   encapsulating material covering portions of the die, the die pad, and the plurality of leads, the encapsulating material forming a first surface and a second surface of the IC chip opposite of the first surface; and
   a first wire electrically connected to and extending from an interconnect of the die, the first wire protruding through the second surface beyond a plane of the second surface.

20. The IC chip of claim 19, wherein the first wire is electrically connected to an external component.

\* \* \* \* \*